United States Patent [19]

Bell et al.

[11] Patent Number: 4,772,213

[45] Date of Patent: Sep. 20, 1988

[54] WATTHOUR METER SOCKET ADAPTER

[75] Inventors: John Bell, Pollyanna Livonia; William Keopfgen, Farmington, both of Mich.

[73] Assignee: Ekstrom Industries, Inc., Farmington Hills, Mich.

[21] Appl. No.: 22,721

[22] Filed: Mar. 6, 1987

[51] Int. Cl.$^4$ ............................................... H01R 9/00
[52] U.S. Cl. .................................... 439/135; 439/465; 439/718
[58] Field of Search .................... 439/135, 463–466, 439/709, 718, 719

[56] References Cited

U.S. PATENT DOCUMENTS 2,788,472  4/1957  Road et al. ........................... 439/709
3,598,900  8/1971  Drake ................................... 439/135

FOREIGN PATENT DOCUMENTS 445864  4/1936  United Kingdom ................ 439/463

Primary Examiner—Joseph H. McGlynn
Attorney, Agent, or Firm—Basile, Hanlon

[57] ABSTRACT

A socket adapter for converting a conventional bottom connected watthour meter housing to a socket-type watthour meter housing. The adapter includes a housing having a watthour meter receiving portion including a plurality of electrical contacts which removably receive the blade terminals of a watthour meter. The contacts are connected via electrical conductors to terminals mounted in an integral terminal portion of the housing. A cover member is removably mountable over the terminal portion of the housing to provide access to the terminals. The terminal portion and the cover cooperate to form guide surfaces which direct the building conductors into engagement with the terminals within the adapter. A surge protector in the form of a pair of wires embedded within the peripheral surface of the watthour meter receiving portion of the housing are connectable through a connector mounted on the back wall of the housing to earth ground.

9 Claims, 5 Drawing Sheets

WATTHOUR METER SOCKET ADAPTER

BACKGROUND OF THE INVENTION

1. Field of the Invention

The present invention relates, in general, to watthour meters and, more specifically, to mounting attachments for watthour meters.

2. Description of the Prior Art

Electrical watthour meters have long been used to measure the amount of electrical power consumed by a particular machine or electrical utility customer. Watthour meters have been constructed in various configurations depending upon the type of electrical service that is required. Typically, the watthour meters have a circular cross-section and are mounted on a wall or support surface of a building or residence. They include gauges which indicate the amount of power consumed by the customer. Older watthour meters of the so-called bottom connected type are formed of a single piece housing in which the watthour meter was fixedly mounted along with terminals which provided connection to the building wiring. Any defect in the watthour meter requires replacement of the entire housing. To overcome this problem, socket-type watthour meters have been devised in which the watthour meter plugs into a base having contacts connected to terminals and the building wiring. This enables defective watthour meters to be easily replaced without removing the entire housing and internal conductors.

However, despite the advantages afforded by currently available socket-type watthour meters, improvements are still durable in the ease of manufacture of the socket-type housing, an adapter which would easily convert existing bottom connector watthour meter housings to a socket-type housing and a watthour meter housing which providing effective surge potential.

SUMMARY OF THE INVENTION

The present invention is a socket adapter for an electrical watthour meter which converts so-called bottom connected watthour meter installations to socket-type watthour meter installations. The adapter includes a housing having a watthour meter receiving portion and a terminal portion. The watthour meter receiving portion includes a back wall and upstanding side walls generally in a circular configuration. A plurality of electrical contacts are mounted on the back wall and receive blade terminals on the plug in, socket-type watthour meter. Electrical conductors extend between the contacts and individual terminals in the terminal portion of the housing. The terminals in turn are connected to the individual conductors of the building wiring.

Each terminal is mounted in a slot formed by spaced dividers extending upward from the terminal portion of the housing. The outer ends of the dividers are formed as guide means with inwardly tapering edges to urge the building wiring conductors into the slots and into engagement with the terminals.

A removable cover is lockably attachable to the terminal portion of the housing and includes dividers complimentary formed to the dividers in the terminal portion to complete the conductor guide means.

Surge protection means are also provided in the housing in the form of a wire embedded in a portion of the circumferential peripheral edge of the watthour meter receiving portion of the housing. The wire is connected through the back of the housing to earth ground via a suitable connector.

The present watthour meter socket adapter provides numerous advantages over previously devised watthour meter socket adapters of the plug-in, socket type. The guide means formed on the terminal portion and the cover allow easy insertion and connection of the building conductors to the terminals in the adapter. The two-piece terminal housing simplifies manufacturing the adapter since less expensive and less complex molds are required to form the housing. Furthermore, the two piece housing with a removable cover provides easy access to the terminals within the terminal portion of the housing.

Finally, the placement of the surge protection wiring within the housing itself again simplifies manufacturing of the housing and provides a simple and inexpensive means for protecting the watthour meter from electrical power surges.

BRIEF DESCRIPTION OF THE DRAWING

The various uses, advantages and other features of the present invention will become more apparent by referring to the following detailed description and drawing in which.

DESCRIPTION OF THE PREFERRED EMBODIMENTS

Figure 1:
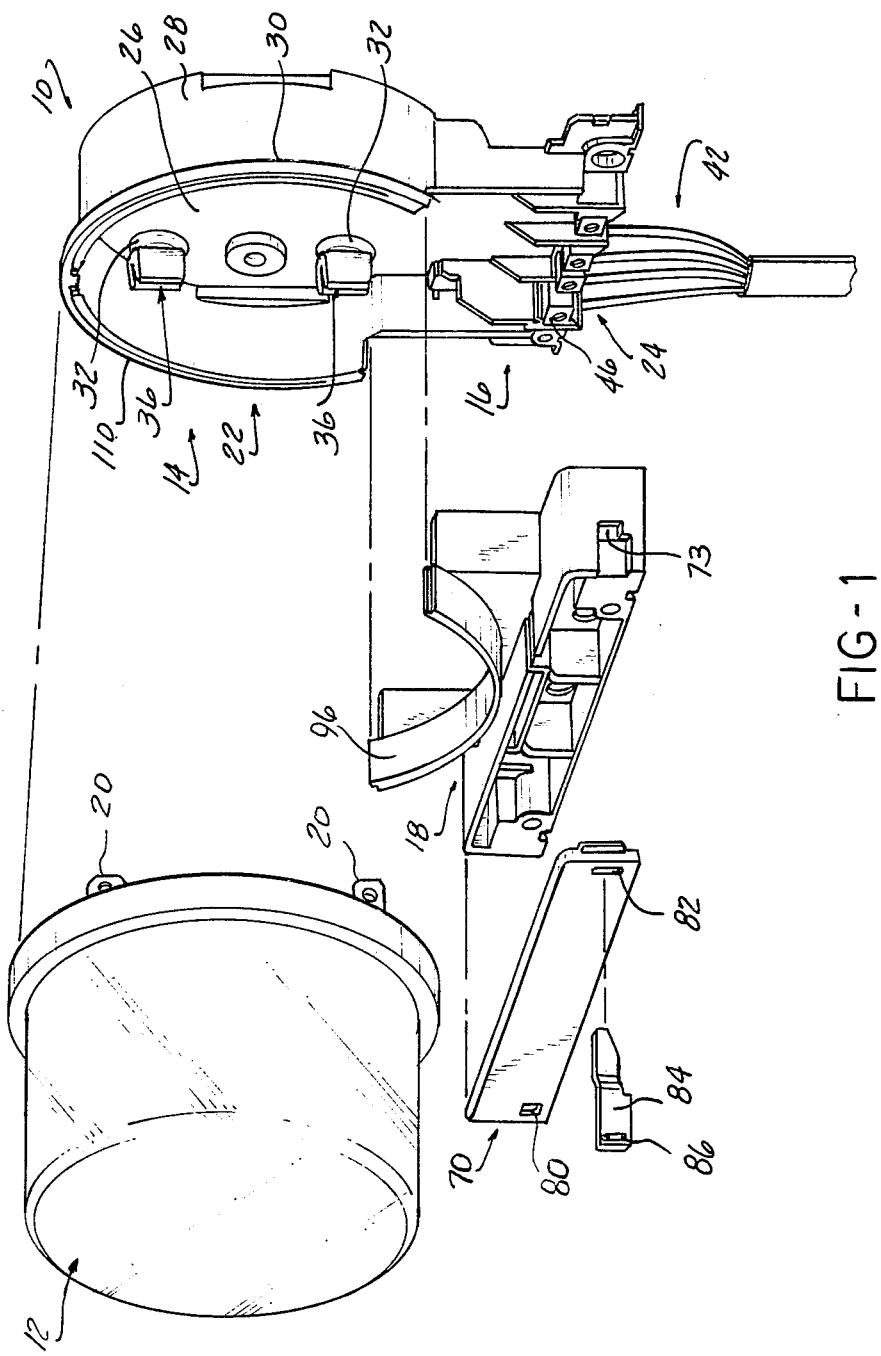
FIG. 1 is an exploded, perspective view of the watthour meter socket adapter of the present invention.

Throughout the following description and drawing, an identical reference number is used to refer to the same component shown in the various figures of the drawing.

In general, the present invention relates to a socket adapter for converting a bottom connected watthour meter installation to a socket-type watthour meter installation.

Figure 2:
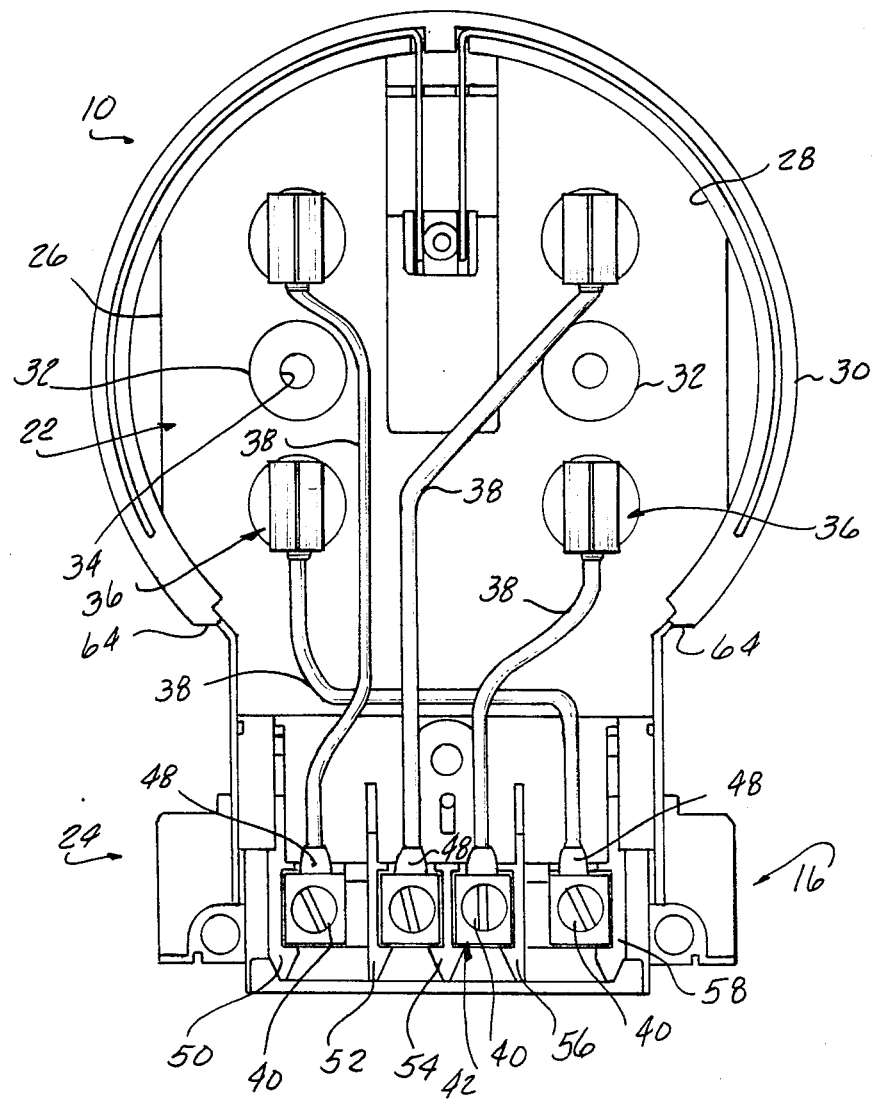
FIG. 2 is plan view of the socket adapter shown in FIG. 1, with the cover removed from the terminal portion of the housing.

As shown in FIGS. 1 and 2, the socket adapter 10 is formed of a housing adapted to receive a conventional socket-type watthour meter 12 which is removably insertable into the housing 10.

The housing of the present invention includes a watthour meter receiving portion 14, a terminal portion 16 and a removable shell cover portion 18. The watthour meter 12 is shown by way of example and does not form a part of the present invention. It is illustrated merely for its provision of a plurality of blade terminals or contacts 20 which extend outward from the rear wall of the watthour meter 12 for connection to the adapter 10 and provide electrical conductivity between the internal components of the watthour meter 12 and the building wiring. Other types of watthour meters may also be employed having different blade terminal 20 configurations.

The watthour meter receiving portion 14 has a backwall 16 and an upstanding side wall 28 generally of circular configuration. The outer peripheral edge of the side wall 28 is formed with an outwardly extending flange 30 which forms a lip extending outward from the side wall 28. A portion of the bottom circumferential periphery of the flange 30 is broken away and left open to receive a cover member as described hereafter.

A plurality of contact mounting bases denoted in generally by reference number 32 in FIG. 2 are formed integrally in the backwall 26 of the watthour meter receiving portion 14 of the adapter 10. The contact mounting bases 32 have a raised portion with an integral aperture 34 for mounting the contacts shown in general by reference number 36 thereon. The contacts 36 are in the form of a pair of spring biased fingers which are formed of an electrically conductive material and receive an electrical conductor or blade terminal 20 therein as described hereafter. Due to the spring biased nature of each contact 36, a blade terminal 20 of the watthour meter 12 may be inserted therein to provided electrical connection between the watthour meter 12 and the contact 36 of the socket adapter 10.

As shown in FIG. 2, individual electrical conductors denoted in general by reference number 38 extend between the contacts 36 and individual terminals 40 mounted in the terminal portion 16 of the housing 10 to provide connection between the watthour meter 12 and the building wiring 43.

By example only, the terminal portion 16 of the socket adapter 10 is shown with four terminals 40. It will be understood that other terminal configurations and number of terminals may be also employed in the present invention depending upon the particular electrical power needs of the user of the socket adapter 10 of the present invention.

Figure 5:
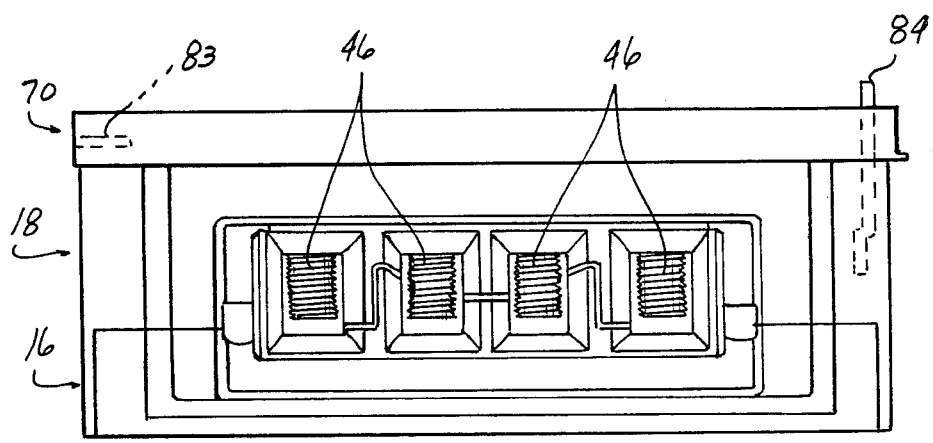
FIG. 5 is a front-elevational view of the terminal portion of the socket adapter with the cover attached.

As noted above, the housing 10 also includes a terminal portion 16 which provides a mounting surface for the terminals 40. The terminal portion 16 of the adapter 10 provides a means for connecting the conductors 38 to the individual terminals 40 and to the building or residence wiring connections denoted in general by reference number 43 in FIG. 1. The terminal connections generally comprise an elongated, electrically conductive screw 42 which is threadingly mounted within a rectangularly shaped, electrically conductive base or member 46 as shown in Figures 1 and 5.

The lead ends 48 of the conductors 38 are mounted on the bottom of the terminal portion 16 of the housing and are spaced from the threaded screw 42. This allows insertion of a correspondingly shaped connector from the building wiring 43 into the slot between the threaded screw 42 and the lead end 48 of the conductor 38.

Figure 3:
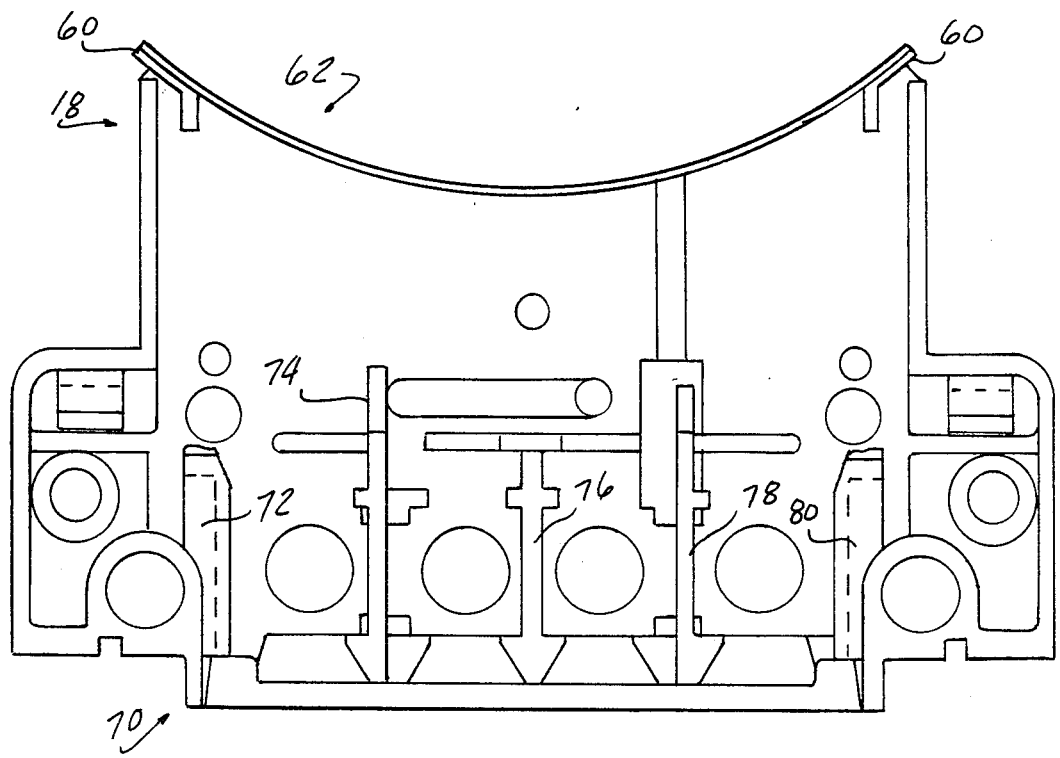
FIG. 3 is a bottom view of the shell cover.
Figure 4:
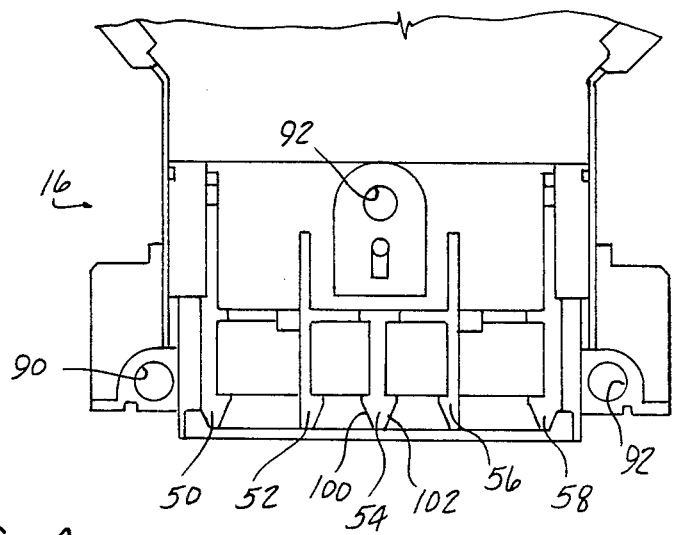
FIG. 4 is a partial, plan view of the terminal portion of the present invention with the terminals and conductors removed.

The terminal bases or members 46 are slidably received within the terminal portion 16 between spaced, parallel divider members denoted by reference numbers 50, 52, 54, 56 and 58. The spaced dividers 50, 52, 54, 56 and 58 as shown in FIG. 4 form a plurality of channels or slots in which the terminal members 46 are slidably disposed Guide means are formed on the dividers 50, 52, 54, 56 and 58 in the form of inwardly extending edges as shown in FIG. 2. The guide means, as shown in FIG. 1 and in greater detail in FIG. 3, also includes the cover member 18 which is insertable into the housing by way of a slot and channel arrangement. As shown in FIG. 3, the outer peripheral edge of the cover member 18 is provided with outwardly extending flanges 60 on opposite ends of an arcuate portion 62 which forms a part of the circular rim of the watthour meter receiving portion 22 of the housing 10. The flanges 60 are removably insertable into correspondingly formed slots 64 formed in the bottom peripheral edges of the rim of the watthour meter receiving portion 22 of the adapter 10 as shown in FIG. 2.

As shown in FIG. 3, the cover 18 is provided with complimentary formed dividers 72, 74, 76, 78 and 80 also having inwardly tapering outer edges which are disposed in registry with the correspondingly shaped portions of the base terminal portion 16 of the housing to form the slots or channels in which the connections are made between the building wiring conductors 43 and the terminals 40. This is shown more clearly in FIG. 5 in which the top 70 is insertable over the cover 18 which, in turn, is mounted on the base terminal portion 16 of the adapter housing.

As shown in FIG. 1, the socket adapter 10 of the present invention also includes a removable top 70 which is insertable over the exposed terminal portion of the cover 18 and the terminal portion 16 of the adapter 10. The top 70 is in the form of a planar member having a horizontally extending projection 83 mounted at one side end which is insertable into a complimentary formed slot in the cover 18. A second slot or bore 82 receives a lock means, such as a key 84, which is insertable through the aperture 82 in the top 70 into a inside surface on the top 70 and a slot 73 formed on the cover 18. The key 84 is provided with a top located slot 86 through which a pin may be inserted to lock the key 84 and top 70 to the cover 18 on the watthour meter adapter 10 to prevent unauthorized tampering or access to the terminal connections housed therein.

Mounting apertures 90 and 92, FIG. 4, are also formed in the terminal portion 24 of the housing for mounting the adapter 10 to a convenient mounting surface of the building or residence. A centrally located aperture 94 is provided for receiving an elongated pin, not shown formed in the cover 18 for aligning the cover 18 with the terminal portion 24 of the adapter 10.

As shown in FIG. 4, the dividers 50 and 52 and the dividers 56 and 58 are formed with inwardly extending edges which face inward into each slot and taper towards the center of the base terminal portion 16. The centrally located divider 54 is provided with two tapering surfaces 100 and 102 each of which faces the tapering surfaces of the spaced dividers 52 and 56. The cover 18 is also provided with correspondingly formed dividers as shown in FIG. 5 which, when the cover shell 18 is inserted over the terminal portion 16, combine and cooperate with the dividers 50, 52, 54, 56 and 58 to form the slots with inwardly tapering guide surfaces to provide ease of connection of the building wiring 43 to the individual terminals 46 of the socket adapter 10.

Figure 6:
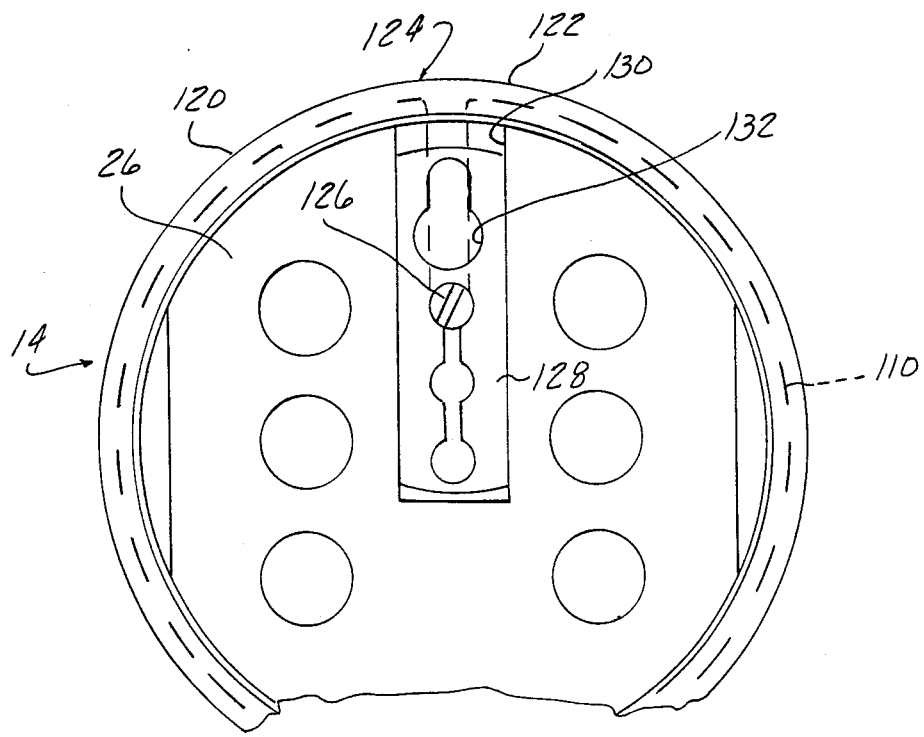
FIG. 6 is a rear view of the socket adapter housing of the present invention.

The watthour meter socket adapter 10 is also provided with surge protection means to protect the watthour meter 12 from excess voltages, such as those caused by lightning strikes, etc. The surge protecting means, as shown generally in FIG. 1 by reference number 110 and in greater detail in FIG. 6, is in the form of a wire which extends along a portion of the peripheral edge of the watthour meter receiving portion 22 of the adapter 10. The surge protection means 110 which extends preferably, approximately 240° around the periphery of the circumferential edge of the watthour meter receiving portion 14 is in the form of two wires 120 and 122 which are embedded in a groove formed in the peripheral edge 30 of the watthour meter receiving portion 14. The wires at their closest proximity denoted in general by reference number 124 are bent downward toward the backwall 26 of the watthour meter receiving portion 14 and again bent perpendicularly to extend along the surface of the back wall 26. An electrically conductive connector 126 electrically connects the wires 120 and 122 and extends through the back wall 26. As shown in FIG. 6, an electrically conductive slidable member 128 is mounted within a slot 130 formed on the exterior surface of the back wall 26 of the watthour meter receiving portion 14. A slot 132 is formed in an upper portion of the conductive member 128 for connection to a conductor connector, not shown, connected to earth ground. This provides a conductive path from the watthour meter 12 to earth ground which will protect the watthour meter 12 from excessive voltage and current surges if the watthour meter 12 is struck by lightning.

Figure 7:
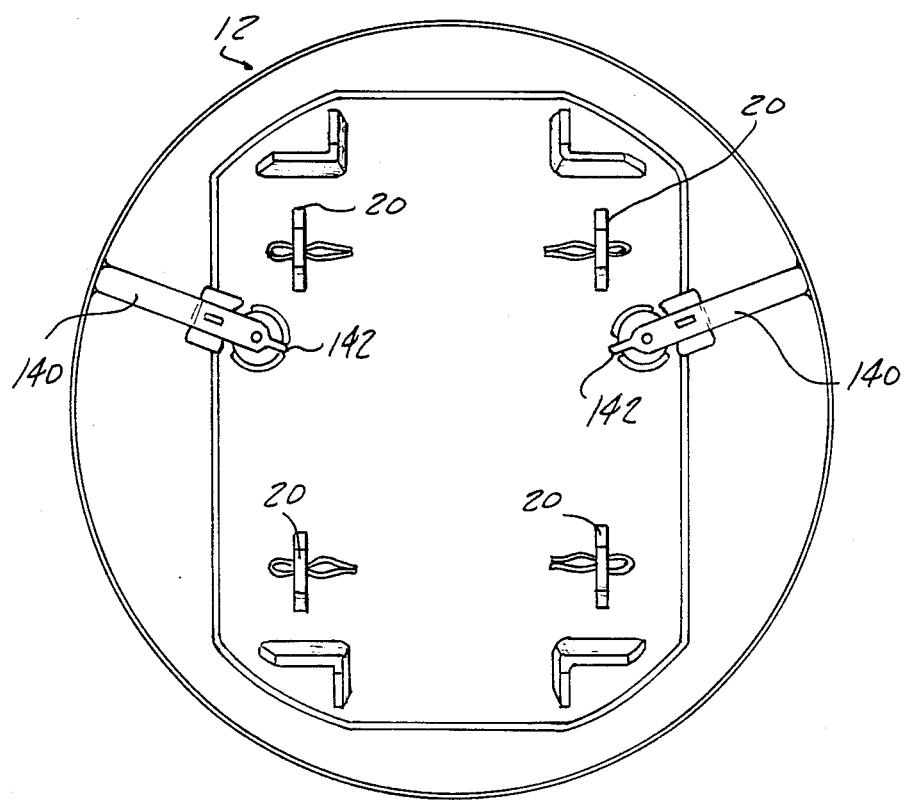
FIG. 7 is a rear view of a typical watthour meter showing the blade terminals and ground surge connection tabs.

As shown in FIG. 7, the watthour meter 12 is provided with at least two electrically conductive tabs 140 which are connected at their interior ends 142 to the internal components of the watthour meter 12. The tabs 140 engage the surge protection wires 120 and 122 when the watthour meter 12 is mounted in the adapter 10 to complete an electrical circuit which protects the watthour meter 12 from excess voltage and current surges.

In summary, there has been disclosed a unique socket adapter for converting a bottom connected watthour meter installation to a socket-type watthour meter installation. The adapter is inexpensive in construction and can be configured to be mountable on any conventional bottom connected watthour meter housing and to convert such a watthour meter housing for socket-type watthour meter installations. The adapter is inexpensive in manufacturing costs and provides easy access by way of its removable cover to the terminals connecting the watthour meter adapter connections to existing building conductors. The watthour meter socket adapter also includes a unique surge protection means which protects the installed watthour meter from excessive voltage and current surges caused by lightning strikes, etc.

What is claimed is:

1. A watthour meter socket adapter for mounting a socket-type watthour meter having a plurality of blade type electrical terminals to a building comprising:
   a housing, the housing including:
   a watthour meter receiving portion;
   a plurality of biased electrical contacts mounted within the watthour meter receiving portion for removably receiving the blade type electrical terminals of a socket-type watthour meter in a snap-in connection;
   a terminal portion integrally formed with the watthour meter receiving portion;
   a plurality of electrical terminals mounted within the terminal portion;
   a plurality of electrical conductors connected between the contacts in the watthour meter receiving portion and the terminals in the terminal portion of the housing; and
   guide means formed in the terminal portion of the housing for guiding the electrical wiring conductors of the building into engagement with the terminals in the terminal portion of the housing.

2. The watthour meter socket adapter of claim 1 further including:
   surge protection means mounted within the housing and connectable to earth ground.

3. The watthour meter socket adapter of claim 1 wherein the guide means comprises:
   dividers disposed between each of the individual terminals in the terminal portion and forming slots therebetween;
   the terminals being slidably disposed within the slots between the dividers;
   each of the dividers having an outer edge inwardly tapered towards the adajcent slot to provide a surface for guiding the building wiring conductors into engagement with the terminals in the housing.

4. The watthour meter socket adapter of claim 3 further including:
   a cover removably disposable into engagement with the terminal portion of the housing;
   the cover including:
   a plurality of spaced dividers formed with complimentary shaped outer, inwardly tapering edges to cooperate in an engaged manner with the dividers on the terminal portion of the housing to form the slots for urging inward the building conductors into engagement with the terminals in the housing.

5. The watthour meter socket adapter of claim 1 further including:
   a cover removably engageable with the terminal portion of the housing;
   means for slidably attaching the cover to the housing, the attaching means comprising:
   complementary formed slot and flange means formed on the watthour meter receiving portion of the housing and the peripheral edges of the cover for removable insertion of the cover into the housing.

6. The watthour meter socket adapter of claim 5 further including:
   a removable top;
   key means lockably insertable through a portion of the top and engageable with the underlying cover for releasably locking the top to the cover.

7. A watthour meter socket adapter for mounting a socket-type watthour meter to a building comprising:
   a housing, the housing including:
   a watthour meter receiving portion;
   a plurality of electrical contacts mounted within the watthour meter receiving portion for receiving the terminals of a socket-type watthour meter;
   a terminal portion integrally formed with the watthour meter receiving portion;
   a plurality of electrical terminals mounted within the terminal portion;
   a plurality of electrical conductors connected between the contacts in the watthour meter receiving portion and the terminals in the terminal portion of the housing;
   guide means formed in the terminal portion of the housing for guiding the electrical wiring conductors of the building into engagement with the terminals in the terminal portion of the housing; and
   surge protection means mounted within the housing and connectable to earth ground for protecting the watthour meter from electrical power surges, the surge protection means comprising a pair of wires embedded within the watthour meter receiving portion of the housing and connectable through the housing to earth ground.

8. The watthour meter socket adapter of claim 7 wherein the wires are mounted in the peripheral edge of the watthour meter receiving portion of the housing.

9. A watthour meter socket adapter for mounting a socket-type watthour meter having a plurality of blade type electrical terminals to a building comprising:
a housing, the housing including:
a watthour meter receiving portion;
a plurality of biased electrical contacts mounted within the watthour meter receiving portion for removably receiving the blade type electrical terminals of a socket-type watthour meter in a snap-in connection;
a terminal portion integrally formed with the watthour meter receiving portion;
a plurality of electrical terminals mounted within the terminal portion;
a plurality of electrical conductors connected between the contacts in the watthour meter receiving portion and the terminals in the terminal portion of the housing; and
guide means formed in the terminal portion of the housing for guiding the electrical wiring conductors of the building into engagement with the terminals in the terminal portion of the housing.

* * * * *